United States Patent
Kang

(10) Patent No.: US 7,336,523 B2
(45) Date of Patent: *Feb. 26, 2008

(54) MEMORY DEVICE USING NANOTUBE CELLS

(75) Inventor: Hee Bok Kang, Daejeongwangyeok-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/058,201

(22) Filed: Feb. 16, 2005

(65) Prior Publication Data

US 2005/0180195 A1   Aug. 18, 2005

(30) Foreign Application Priority Data

Feb. 16, 2004   (KR) .................... 10-2004-0010039

(51) Int. Cl.
*G11C 11/39* (2006.01)
*G11C 11/4197* (2006.01)
*G11C 8/12* (2006.01)
*B82B 1/00* (2006.01)

(52) U.S. Cl. ............... 365/151; 365/149; 365/159; 365/180; 365/230.03; 977/943; 977/936

(58) Field of Classification Search ............... 365/149, 365/151, 159, 180, 230.03, 71; 977/742, 977/936, 940, 943

See application file for complete search history.

(56) References Cited

U.S. PATENT DOCUMENTS

| 4,066,915 | A | | 1/1978 | Ohhinata |
| 4,677,455 | A | | 6/1987 | Okajima |
| 4,882,706 | A | * | 11/1989 | Sinclair .................. 365/180 |
| 5,535,156 | A | * | 7/1996 | Levy et al. ............... 365/175 |
| 5,715,189 | A | * | 2/1998 | Asakura .................... 365/72 |
| 6,128,216 | A | * | 10/2000 | Noble et al. ............. 365/154 |
| 6,229,161 | B1 | * | 5/2001 | Nemati et al. ........... 257/133 |
| 6,824,908 | B2 | | 11/2004 | Yamaura et al. |
| 2002/0006539 | A1 | | 1/2002 | Kubota et al. |
| 2004/0234841 | A1 | | 11/2004 | Yoshitake et al. |
| 2005/0040048 | A1 | | 2/2005 | Kim et al. |
| 2005/0180193 | A1 | * | 8/2005 | Kang ....................... 365/149 |
| 2005/0180194 | A1 | * | 8/2005 | Kang ....................... 365/149 |

\* cited by examiner

*Primary Examiner*—J. H. Hur
(74) *Attorney, Agent, or Firm*—Townsend and Townsend and Crew LLP

(57) ABSTRACT

A memory device using a nanotube cell comprises a plurality of nanotube sub-cell arrays each having a hierarchical bit line structure including a main bit line and a sub-bit line. In the memory device, a nanotube cell array comprising a capacitor and a PNPN nanotube switch which does not require an additional gate control signal is located between a word line and the sub-bit line, so that a cross point cell array is embodied to reduce the whole chip size.

11 Claims, 10 Drawing Sheets

MEMORY DEVICE USING NANOTUBE CELLS

BACKGROUND OF THE INVENTION

1. Field of the Invention

The present invention generally relates to a memory device using a nano tube cell, and more specifically, to a technology of reducing the whole memory size by providing a plurality of nano tube sub cell arrays as a cross point cell in a hierarchical bit line structure including a main bit line and a sub bit line.

2. Description of the Prior Art

Generally, a Dynamic Random Access Memory (hereinafter, referred to as 'DRAM') comprises a transistor for performing a switching operation depending on a state of a word line to connect a capacitor to a bit line, and the capacitor connected between a plate line and one terminal of the transistor.

Here, a switching device of a conventional DRAM cell is a NMOS transistor whose switching operation is controlled by a gate control signal. However, when a cell array is embodied by using the NMOS transistor as a switching device, the whole chip size is increased.

Meanwhile, a refresh characteristic of the DRAM cell is determined by the leakage current characteristic of the NMOS transistor. When the channel length of the NMOS transistor is decreased to a nano meter (1/one billion) scale, short channel leakage current increases more by the current characteristic of a sub threshold voltage Sub Vt of the NMOS transistor. As a result, it is difficult to satisfy the refresh characteristic of the DRAM cell. Also, junction leakage current is generated in a storage node terminal which occupies a relatively large area in the DRAM cell.

Specifically, as the capacity of the DRAM increases in embodiment of a DRAM in the giga bite class, the cell size becomes smaller, and also the capacitance of the cell is reduced. In order to stably drive the DRAM cell having small capacitance, capacitance of a bit line is required to be smaller.

Therefore, it is necessary to reduce capacitance of each cell by embodying a bit line structure of the DRAM as a hierarchical bit line structure including a main bit line and a sub bit line, and reduce the whole size by embodying a cross point cell using a capacitor and a PNPN nano tube switch which does not require an additional gate control signal.

SUMMARY OF THE INVENTION

It is an object of the present invention to provide a DRAM having a hierarchical bit line structure including a main bit line and a sub bit line to reduce capacitance of each cell, thereby reducing the size of a capacitor.

It is another object of the present invention to provide a nano tube sub cell array using a capacitor and a PNPN nano tube switch which does not require an additional gate control signal, thereby reducing the whole size of the memory.

It is still another object of the present invention to effectively drive read/write operations in the above-described nano tube sub cell array using a PNPN nano tube switch, thereby improving operation characteristics of memory cells.

In an embodiment, a memory device using a nano tube cell comprises a cell array block and a sense amplifier array. The cell array block comprise a nano tube sub cell array which has hierarchical bit line structure including a main bit line and a sub bit line and includes a plurality of unit nano tube cells arranged in row and column directions between a word line and the sub bit line. The sense amplifier array, connected to the cell array block through the main bit line, senses and amplifies data applied from the cell array block. Here, each of the plurality of unit nano tube cells comprises a capacitor and a PNPN nano tube switch. One terminal of the capacitor is connected to a word line. The PNPN nano tube switch, which includes at least two or more PNPN diode devices successively connected in series and divided into two groups each connected in parallel between the sub bit line and the other terminal of the capacitor, is selectively switched depending on voltage applied to the word line and the sub bit line.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
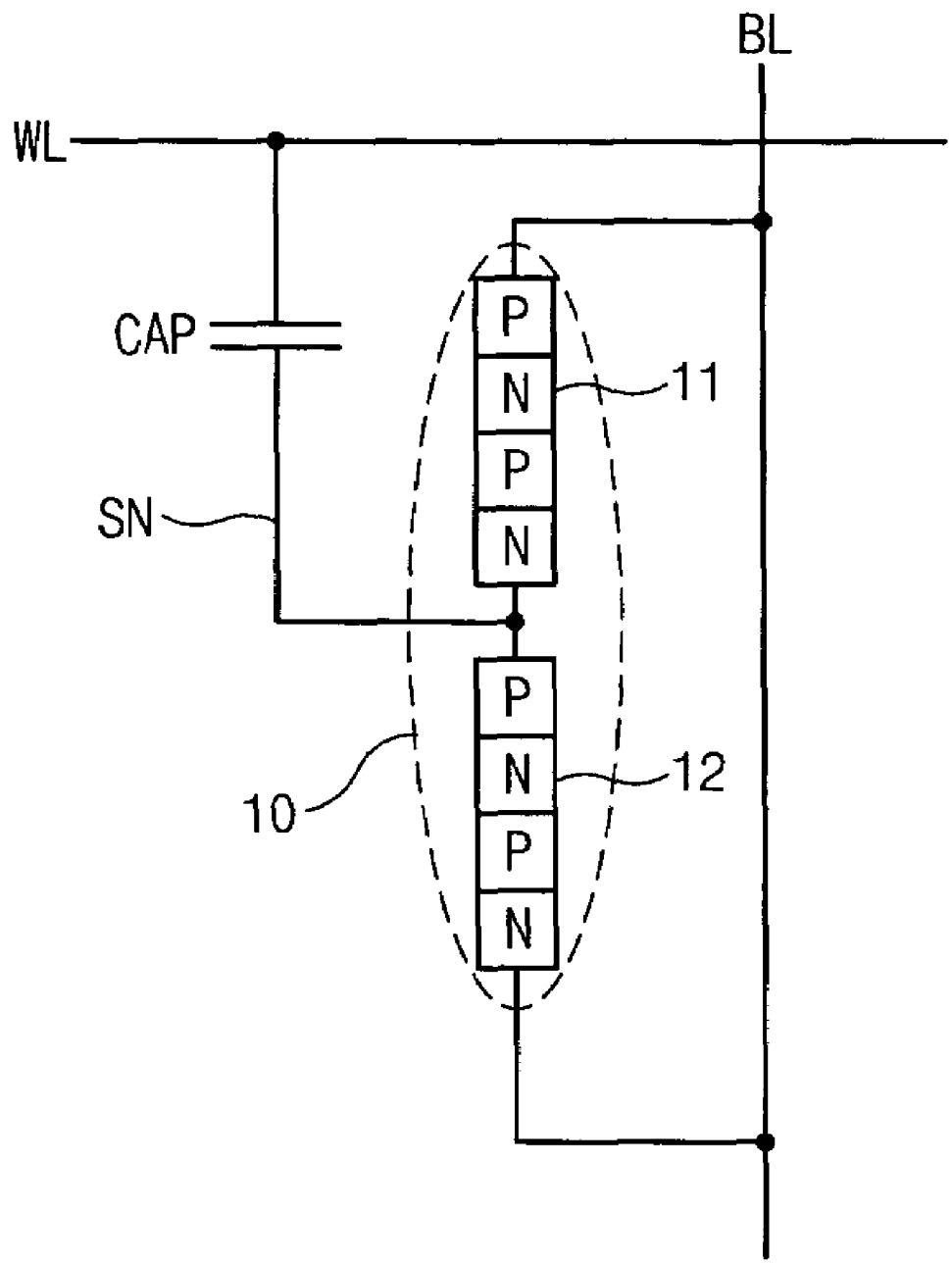
FIG. 1 is a diagram illustrating a unit nano tube cell according to an embodiment of the present invention.

FIG. 1 is a diagram illustrating a unit nano tube cell according to an embodiment of the present invention.

In an embodiment, the unit nano tube cell comprises a capacitor CAP and a PNPN nano tube switch 10. Here, the PNPN nano tube switch 10 comprises PNPN diode switches 11 and 12. The PNPN diode switches 11 and 12 are connected in parallel between a bit line BL and a bottom electrode of the capacitor CAP.

The PNPN diode switch 11 is connected backward between the bit line BL and one electrode of the capacitor CAP, and the PNPN diode switch 12 is connected forward between the bit line BL and one electrode of the capacitor CAP. The other electrode of the capacitor CAP is connected to a word line WL.

Figure 2:
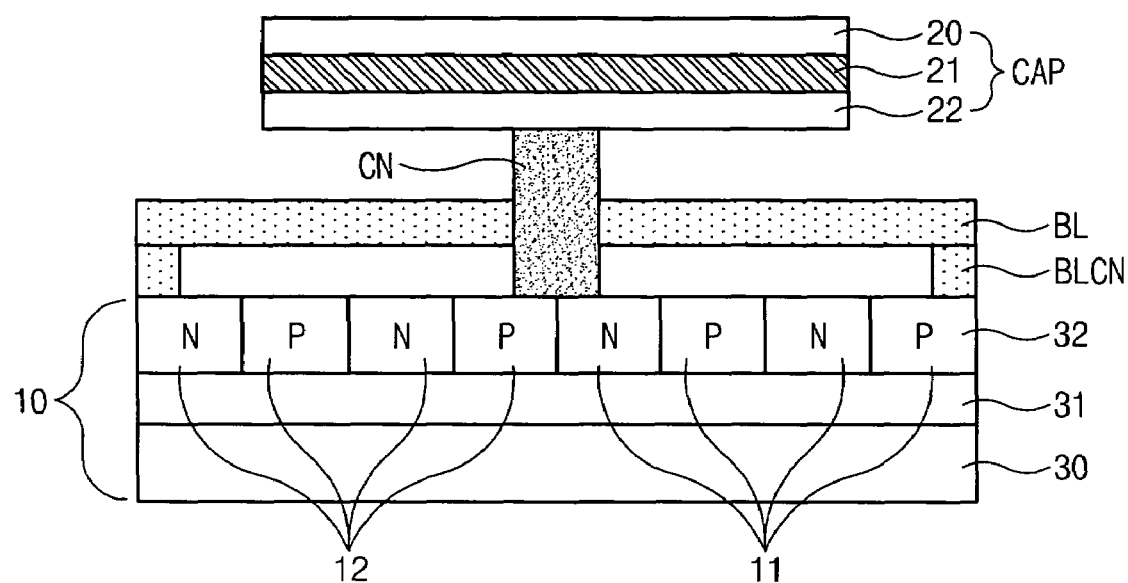
FIG. 2 is a cross-sectional diagram illustrating a nano tube cell according to an embodiment of the present invention.

FIG. 2 is a cross-sectional diagram illustrating the nano tube cell of FIG. 1.

The PNPN nano tube switch 10 comprises an insulating layer 31 formed on a silicon substrate 30 and a silicon layer 32 formed on the insulating layer 31, to have a SOI (Silicon On Insulator) structure. Here, the insulating layer 31 made of SiO$_2$ is deposited on the silicon substrate 30, and the silicon layer 32 is formed on the insulating layer 31. The silicon layer 32 forms a diode chain with a nano tube type including the PNPN diode switches 11 and 12 made of deposition silicon which are connected serially.

Each of the PNPN diode switches 11 and 12 includes a plurality of P-type regions and N-type regions which are alternately connected in series. The PN diode switch 12 includes a P-type region and a N-type region which are connected serially to the adjacent N-type region of the PNPN diode switch 11.

The bit line BL is formed through a bit line contact node BLCN on the N-type region of the PNPN diode switch 12 and the P-type region of the PNPN diode switch 11. Also, the P-type region of the PNPN diode switch 12 and the N-type region of the PNPN diode switch 11 are connected to a bottom electrode 22 of the capacitor CAP through a common contact node CN.

Here, the capacitor CAP comprises a top electrode 20, a dielectric layer 21 and a bottom electrode 22. The top electrode 20 of the capacitor CAP is connected to the word line WL.

Figure 3:
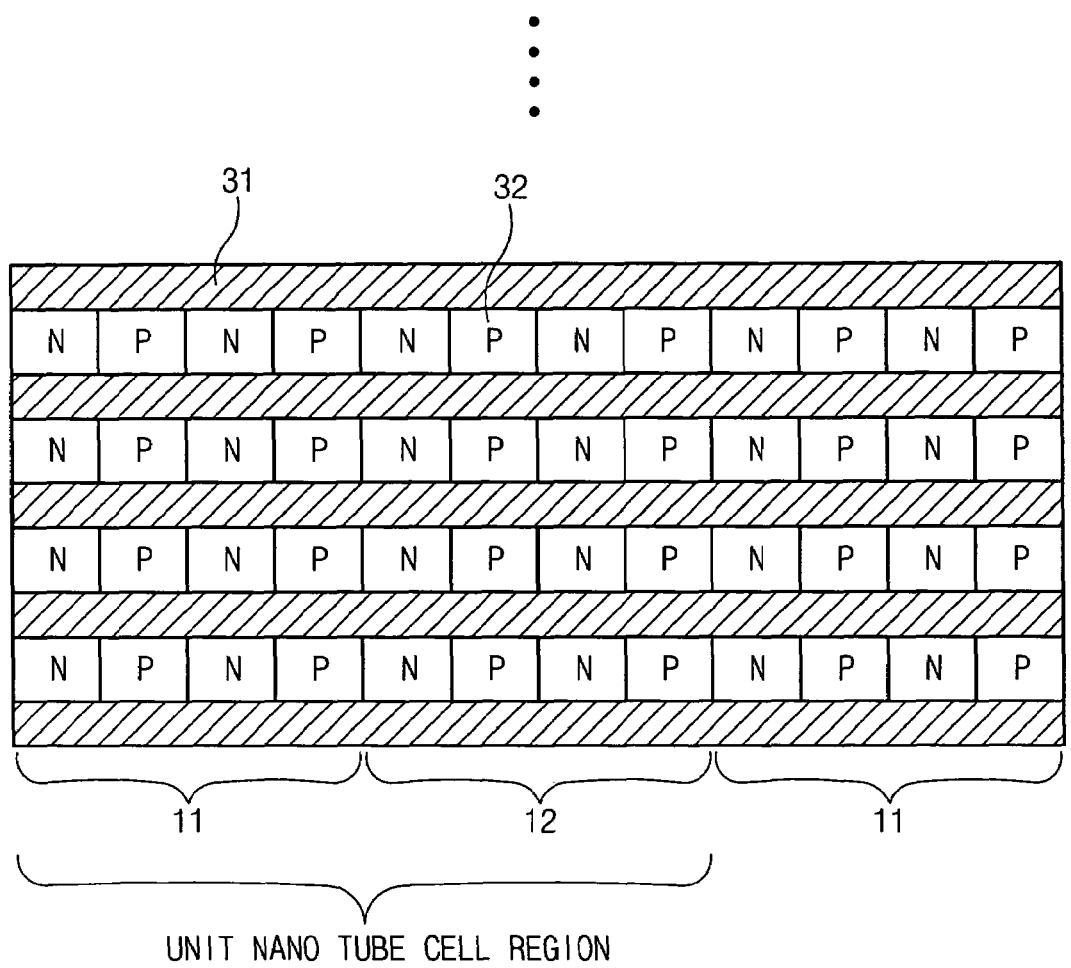
FIG. 3 is a plane diagram illustrating a PNPN nano tube switch of FIG. 1.

FIG. 3 is a plane diagram illustrating the PNPN nano tube switch of FIG. 1.

The PNPN nano tube switch 10 includes the PNPN diode switches 11 and 12 which are formed of the silicon layer 32 and successively connected with a serial chain type. That is, one PNPN nano tube switch 10 comprises the PNPN diode switches 11 and 12 which are connected serially. A nano tube cell adjacent to the one nano tube cell in the same direction includes the PNPN diode switches 11 and 12 which are connected serially.

The PNPN nano tube switch 10 is arranged as a plurality of layers, and the upper PNPN nano tube switch 10 and the lower PNPN nano tube switch 10 are separated by the insulating layer 31.

As a result, one nano tube cell region is configured by selecting one of the PNPN diode switches 11 and 12 successively from diode devices connected in series.

Figure 4:
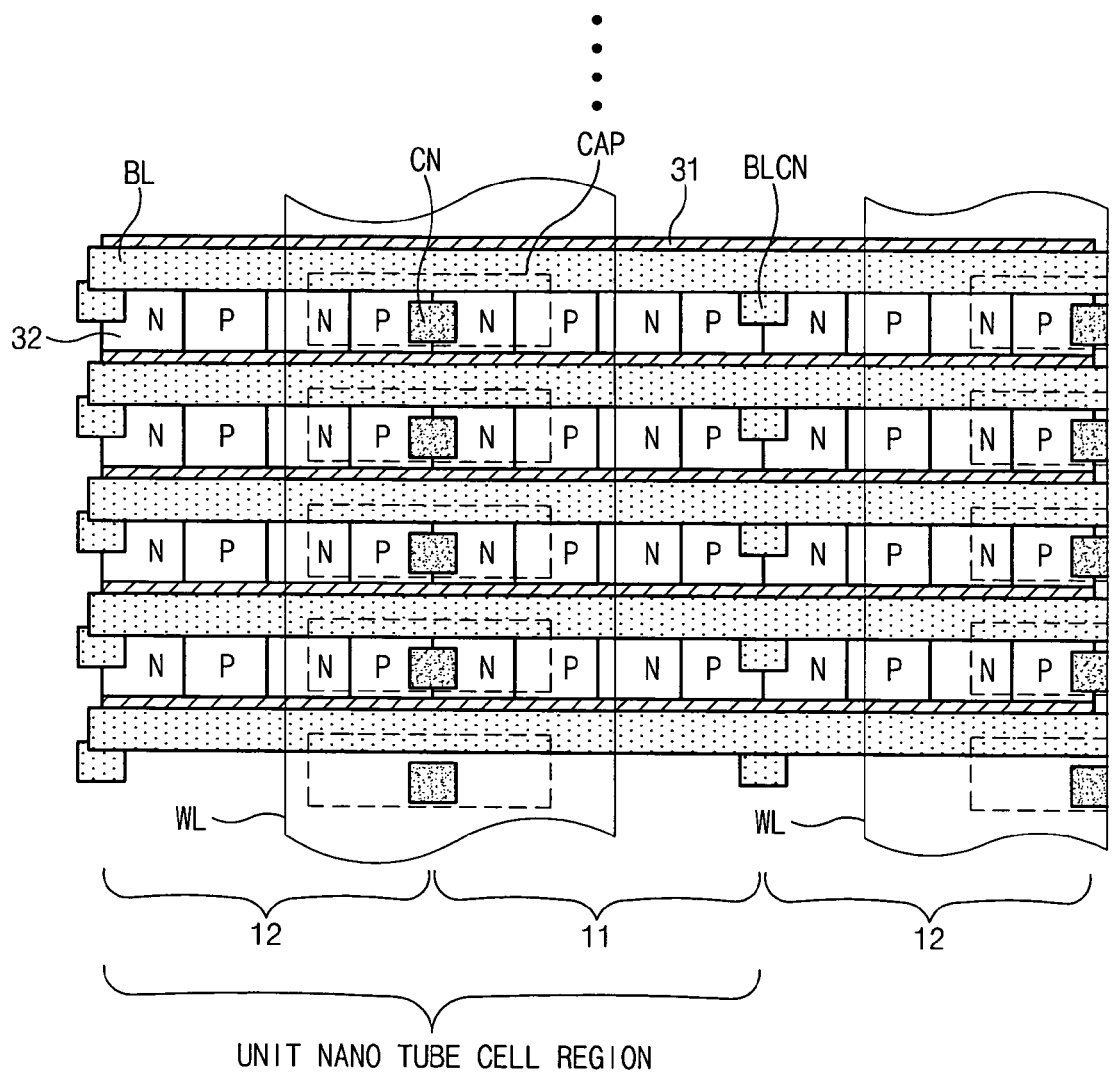
FIG. 4 is a plane diagram illustrating a nano tube cell according to an embodiment of the present invention.

FIG. 4 is a plane diagram illustrating the nano tube cell of FIG. 1.

The silicon layer 32 made of deposition silicon forms the PNPN diode switches 11 and 12 which are connected serially. In each silicon layer 32, its upper and lower portions are insulated through the insulating layer 31. In the PNPN nano tube switch 10, the P-type region of the PNPN diode switch 12 is formed adjacent to the N-type region of the PNPN diode switch 11 to be connected in common to a contact node CN of the capacitor CAP.

Also, the N-type region of the PNPN diode switch 12 and the P-type region of the PNPN diode switch 11 are connected to the bit line BL through the bit line contact node BLCN. The bit line contact node BLCN is connected in common to the bit line contact node BLCN of the adjacent nano tube cell. That is, the same bit line contact node BLCN is connected in common to the P-type region of the PNPN diode switch 11 and the N-type region of the adjacent PNPN diode switch 12. A word line WL is formed on the capacitor CAP.

Figure 5:
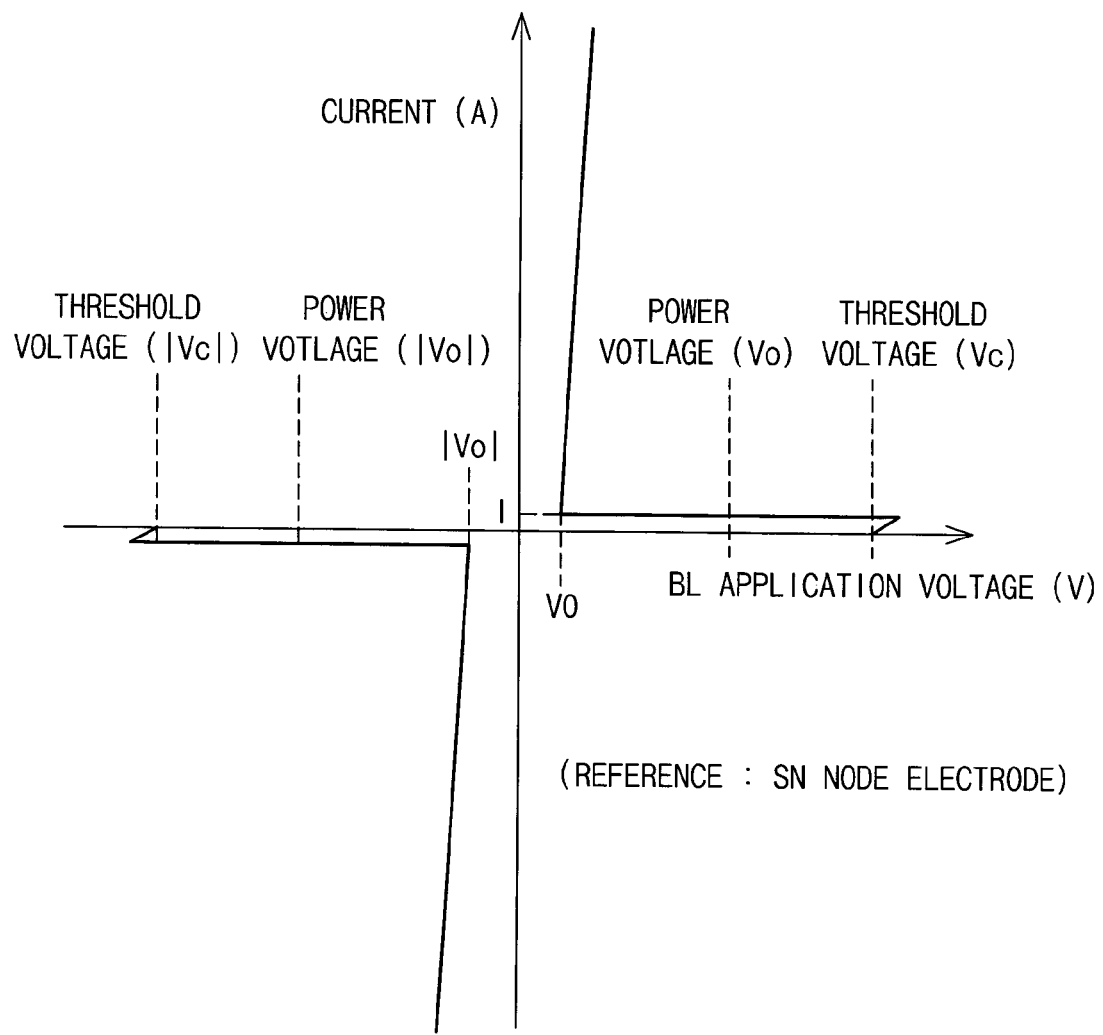
FIG. 5 is a diagram illustrating the operation of the nano tube cell of FIG. 1.

FIG. 5 is a diagram illustrating the operation of the nano tube cell 10 of FIG. 1.

When a voltage applied to the bit line BL increases in a positive direction based on a node SN, the nano tube switch 10 is kept off by the operation characteristic of the PNPN diode switch 11, so that current does not flow in an operating voltage Vo.

Thereafter, when the voltage applied to the bit line BL more increases to reach a threshold voltage Vc, the PNPN diode switch 11 is turned on by the forward operation characteristic of the diode, and the nano tube switch 10 is turned on, so that current dramatically increases. Here, when the voltage applied to the bit line BL is over the threshold voltage Vc, a value of current I depends on that of a resistor (not shown) which serves as load connected to the bit line BL.

A large amount of current can flow even when a small voltage V0 applied to the bit line BL after the PNPN diode switch 11 is turned on. Here, the PNPN diode switch 12 is kept off by the backward operation characteristic.

On the other hand, if the voltage applied to the bit line BL increases in a negative direction based on the node SN, that is, when a constant voltage is applied to the word line WL, the nano tube switch 10 is kept off by the forward operation characteristic of the PNPN diode switch 12, so that current does not flow in an operating voltage |Vo| having an absolute value.

Thereafter, when a voltage applied to the word line WL increases more to reach a threshold voltage |Vc| having an absolute value, the PNPN diode switch 12 is turned on by the forward operation characteristic of the diode to turn on the PNPN nano tube switch 10, so that current increases dramatically. Here, the PNPN diode switch 11 is kept off by the backward operation characteristic.

Figure 6:
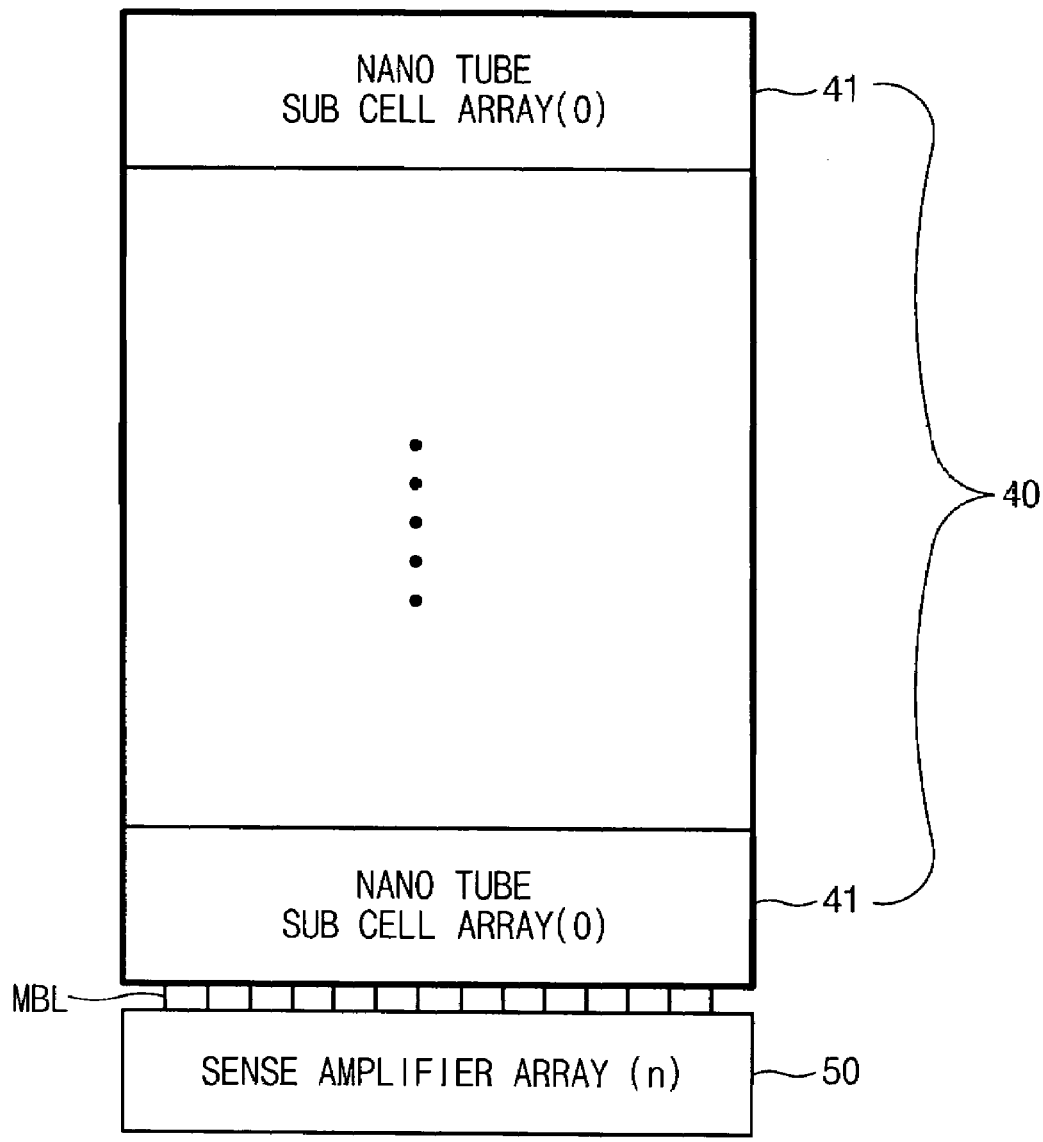
FIG. 6 is a diagram illustrating a memory device using a nano tube cell according an embodiment of the present invention.

FIG. 6 is a diagram illustrating a memory device using a nano tube cell according an embodiment of the present invention.

In an embodiment, the memory device comprises a cell array block 40 and a sense amplifier array 50.

The cell array block 40 includes a plurality of nano tube sub cell arrays 41. The plurality of nano tube sub cell arrays 41 are connected to the sense amplifier array 50 through a main bit line MBL array. The sense amplifier array 50 includes a plurality of sense amplifiers.

Figure 7:
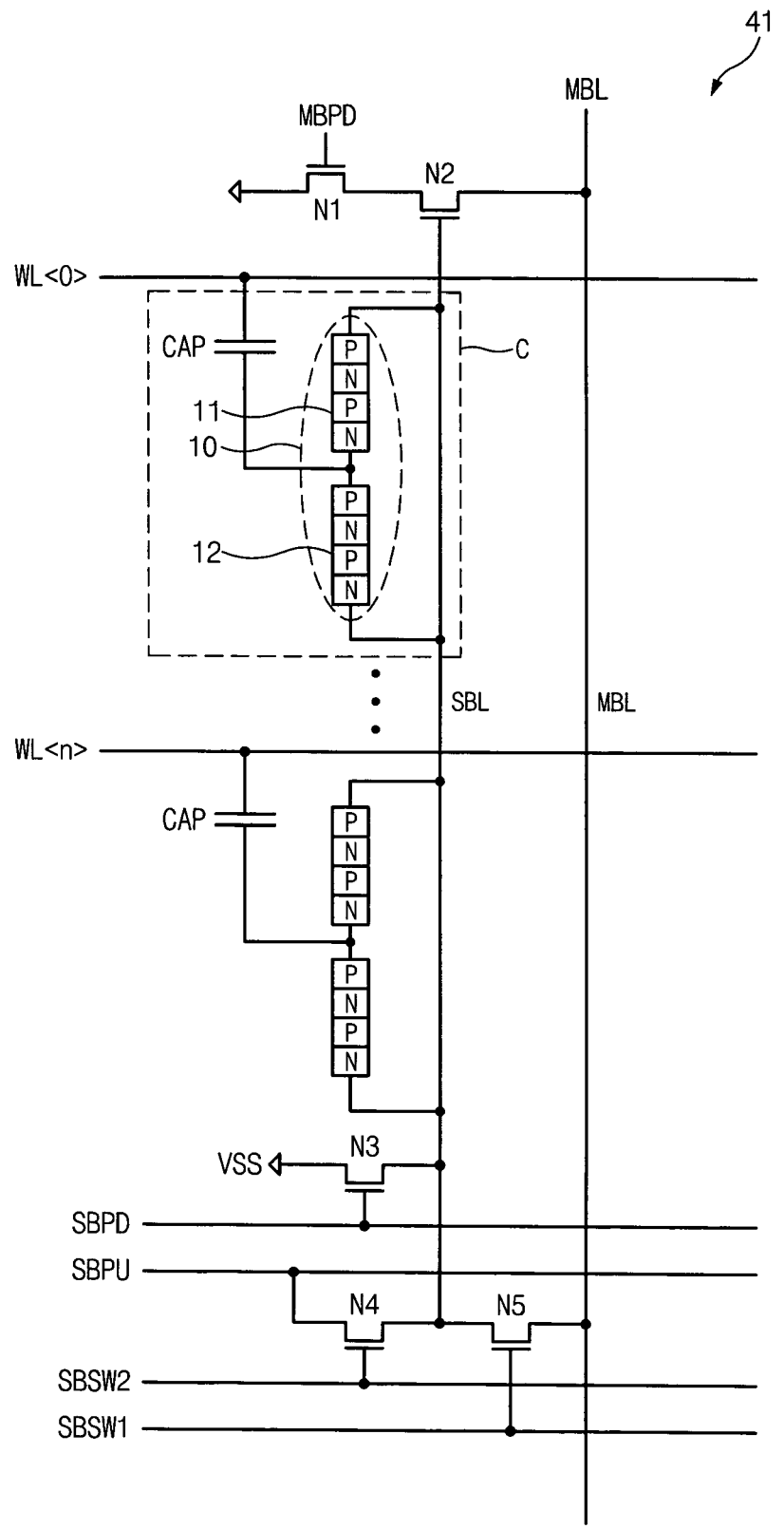
FIG. 7 is a circuit diagram illustrating a nano tube sub cell array of FIG. 6.

FIG. 7 is a circuit diagram illustrating the nano tube sub cell array 41 of FIG. 6.

The nano tube cell array 41 has a hierarchical bit line structure including a main bit line MBL and a sub bit line SBL. Each main bit line MBL of the nano tube sub cell array 41 is selectively connected to one of a plurality of sub bit lines SBL.

When one of a plurality of sub bit line selecting signal SBSW1 is activated, a corresponding NMOS transistor N5 is turned on to activate one sub bit line SBL. Also, a plurality of unit nano tube cells C are connected to one sub bit line SBL.

When a sub bit line pull-down signal SBPD is activated to turn on a NMOS transistor N3, the sub bit line SBL is pulled down to the ground level. The sub bit line pull-up signal SBPU is to control power supplied to the sub bit line SBL. That is, a voltage higher than a power voltage VCC is generated in a low voltage and supplied to the sub bit line SBL.

A NMOS transistor N4 controls connection between a sub bit line pull-up signal SBPU terminal and the sub bit line SBL in response to a sub bit line selecting signal SBSW2.

A NMOS transistor N2 as a current gain transistor (hereinafter, abbreviated as 'CGT'), which is connected between a NMOS transistor N1 and the main bit line MBL, has a gate connected to the sub bit line SBL. The NMOS transistor N1, which is connected between a ground voltage terminal and the NMOS transistor N2, has a gate to receive a main bit line pull-down signal MBPD, thereby regulating a sensing voltage of the main bit line MBL.

Here, the nano tube sub cell array 41 includes a plurality of word lines WL arranged in the row direction and a plurality of sub bit lines SBL arranged in the column direction, which does not require additional plate lines. Since the nano tube cell C is located where the word line WL and the sub bit line SBL are crossed, a cross point cell can be embodied which does not an additional area.

Here, the cross point cell does not comprise a NMOS transistor which uses a word line WL gate control signal. In the cross point cell, the capacitor CAP is located at the cross point where the sub bit line SBL and the word line WL are crossed by using the PNPN nano tube switch 10 that comprises two connection electrode nodes.

Specifically, since the bit line structure according to an embodiment of the present invention is divided into the main bit line MBL and the sub bit line SBL, capacitance distributed to the sub bit line SBL is distributed individually from the main bit line MBL when cell sensing charges of each sub bit line SBL are distributed. As a result, since cell sensing capacitance can be limited by the capacitance of the sub bit line SBL, the ratio occupied by the capacitance in each cell may be reduced.

Figure 8:
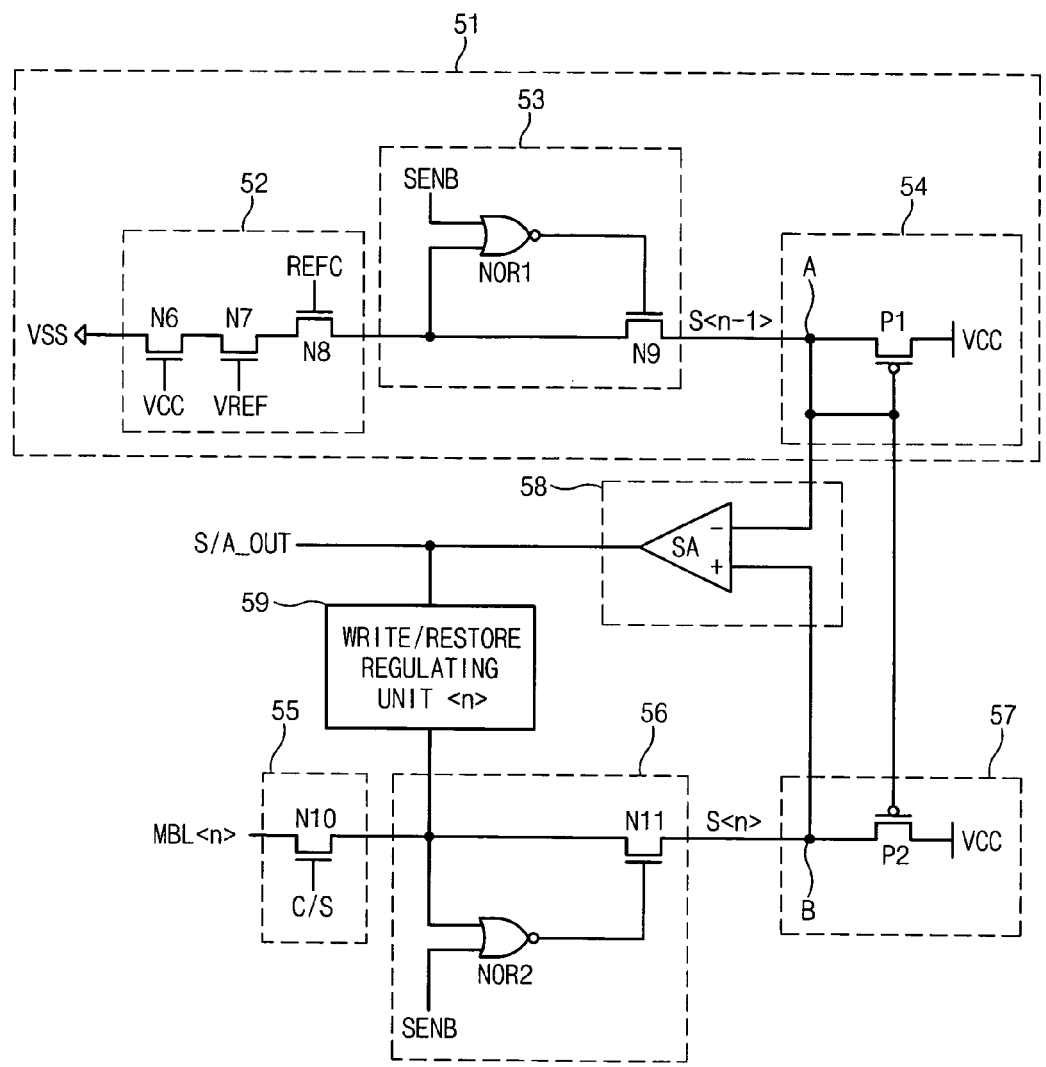
FIG. 8 is a circuit diagram illustrating a sense amplifier of FIG. 6.

FIG. 8 is a circuit diagram illustrating the sense amplifier 50 of FIG. 6.

The sense amplifier array 50 comprises a reference voltage generating unit 51, a column selecting unit 55, a main bit line sensing unit 56, a main bit line sensing load unit 57, a comparison amplification unit 58 and a write/restore regulating unit 59. Here, the reference voltage generating unit 51 includes a reference current regulating unit 52, a sensing unit 53 and a sensing load unit 54.

The reference current regulating unit 52 comprises NMOS transistors N6, N7 and N8. The NMOS transistor N6, connected between a ground voltage terminal and the NMOS transistor N7, has a gate to receive a power voltage VCC. The NMOS transistor N7, connected between the NMOS transistors N6 and N8, has a gate to receive a reference voltage VREF. The NMOS transistor N8, connected between the NMOS transistor N7 and the sensing unit 53, has a gate to receive a reference voltage control signal REFC.

The sensing unit 53 comprises a NOR gate NOR1 and a NMOS transistor N9. The NOR gate NOR1 performs a NOR operation on a sensing enable signal SENB and an output signal from the reference current regulating unit 52. The NMOS transistor N9, connected between the reference current regulating unit 52 and the sensing load unit 54, has a gate to receive an output signal from the NOR gate NOR1. The sensing load unit 54, connected between a power voltage VCC terminal and the NMOS transistor N9, has a gate connected to a negative (−) input terminal of the comparison amplification unit 58.

The column selecting unit 55 comprises a NMOS transistor N10. The NMOS transistor N10, connected between the main bit line MBL<n> and the main bit line sensing unit 56, has a gate to receive a column selecting signal C/S.

The main bit line sensing unit 56 comprises a NOR gate NOR2 and a NMOS transistor Nil. The NOR gate NOR1 performs a NOR operation on the sensing enable signal SENB and an output signal from the column selecting unit 55. The NMOS transistor N11, connected between the column selecting unit 55 and the main bit line sensing load unit 57, has a gate to receive an output signal from the NOR gate NOR2. Here, the main bit line sensing unit 56 is activated when the sensing enable signal SENB is 'low'.

The main bit line sensing load unit 57, connected between the power voltage VCC terminal and the NMOS transistor N11, has a gate connected to the negative (−) input terminal of the comparison amplification unit 58.

The comparison amplification unit 58 comprises a sense amplifier SA. The sense amplifier SA receives a sensing signal S<n-1> applied from a node A through the negative (−) input terminal, and a sensing signal S<n> applied from a node B through a positive (+) input terminal. Then, the sense amplifier SA compares the sensing signals S<n-1> and S<n> to output a sensing output signal S/A_OUT.

The write/restore regulating unit <n> 59 performs a restore operation or outputs data read in a data input/output buffer (not shown) in a read path in response to the sensing output signal S/A_OUT. In a write path, the write/restore regulating unit <n> 59 intercepts a restore path and outputs data inputted through the data input/output buffer to an internal cell array.

The NMOS transistor N6 of the above-described reference current regulating unit 52 has a condition corresponding to that of the NMOS transistor N1 shown in the nano tube cell array 41 of FIG. 7, and is precharged to a ground voltage VSS level when the main bit line pull-down signal MBPD is enabled. The NMOS transistor N7 has a gate to receive the predetermined reference voltage VREF, and sets a standard for distinguishing data 'high' and 'low'. The NMOS transistor N8, which as a condition corresponding to that of the column selecting unit 55, regulates switch resistance in response to a reference voltage control signal REFC.

Data applied to the main bit line MBL are amplified by the main bit line sensing unit 56 and the main bit line sensing load unit 57, and then the sensing signal S<n> is generated. The reference voltage generating unit 51 generates the sensing signal S<n-1> by the reference current regulating unit 52 and the sensing unit 56. Then, the comparison amplification unit 58 compares and amplifies the sensing signal S<n-1> outputted from the reference voltage generating unit 51 with the sensing signal S<n> outputted from the main bit line MBL.

Figure 9:
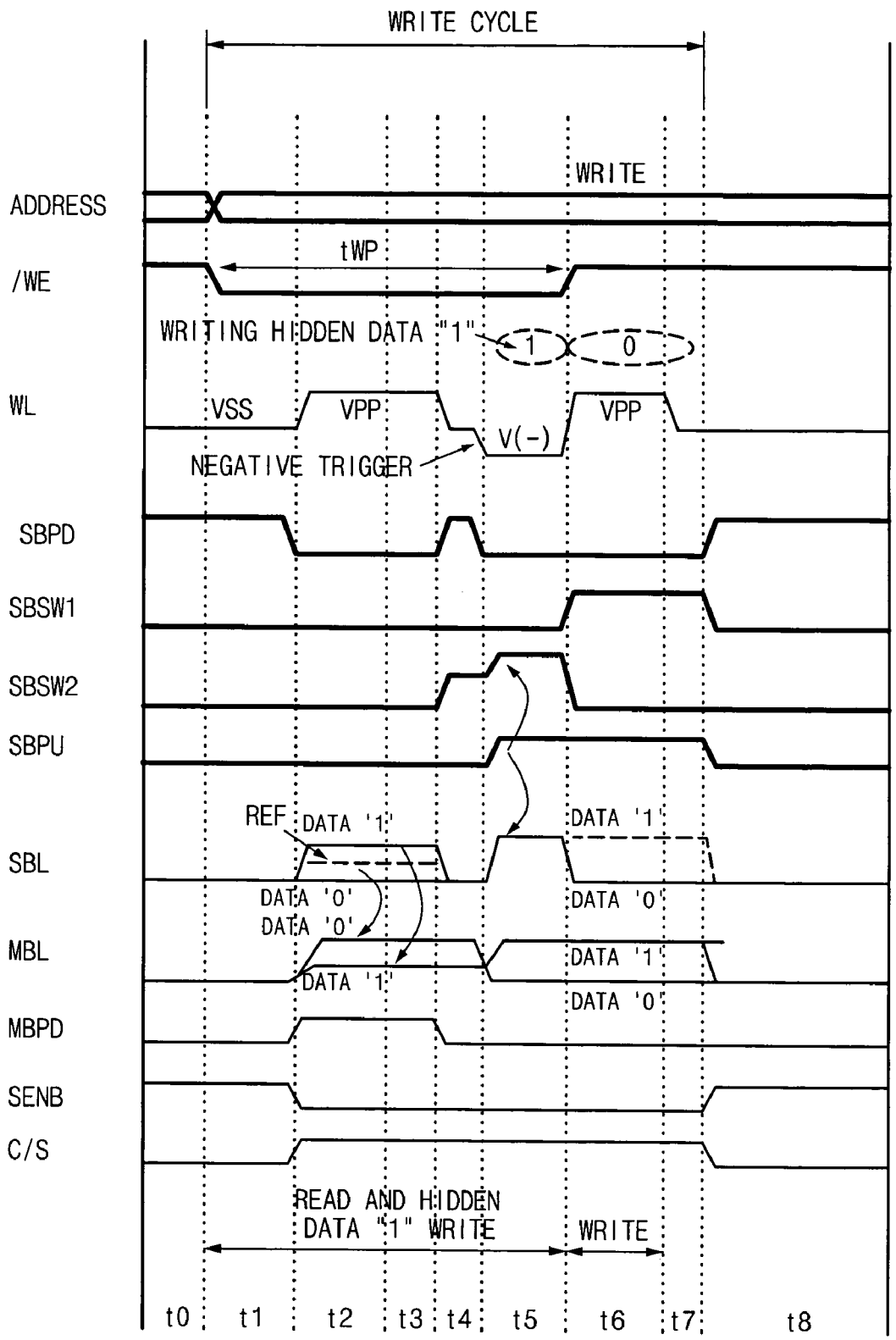
FIG. 9 is a timing diagram illustrating the write mode of the memory device using a nano tube cell according to an embodiment of the present invention.

FIG. 9 is a timing diagram illustrating the write mode of the memory device using a nano tube cell according to an embodiment of the present invention.

When a period t1 starts, if an address is inputted and a write enable signal /WE is disabled to 'low', the operation becomes at a write mode active state. In periods t0 and t1, the sub bit line pull-down signal SBPD is activated to apply the ground voltage to the sub bit line SBL, so that the sub bit line SBL is precharged to the ground level before the word line WL is activated.

Thereafter, when a period t2 starts, if the word line WL is transited to 'high', data of the nano tube cell C are transmitted to the sub bit line SBL and the main bit line MBL. Here, the sub bit line pull-down signal SBPD is transited to 'low', and the main bit line pull-down signal MBPD is transited to 'high'. As a result, voltage levels of the sub bit line SBL and the main bit line MBL rise.

Then, when a period t4 starts, if the word line WL is transited to the ground level and the sub bit line pull-down signal SBPD is enabled, the sub bit line SBL is precharged to the ground level. Here, if the sub bit line selecting signal SBW2 is enabled, the NMOS transistor N4 is turned on to pull down the sub bit line SBL to the ground level. If the main bit line pull-down signal MBPD is transited to 'low', the voltage level of the main bit line MBL is maintained as it is.

In a period t5, the voltage of the word line WL is transited to a negative voltage. That is, a difference between the low voltage level of the sub bit line SBL and the negative voltage level of the word line WL does not reach the state of the threshold voltage Vc to turn on the PNPN diode switch 11 of the PNPN nano tube switch 10.

However, if the sub bit line pull-up signal SBPU and the sub bit line selecting signal SBSW2 are transited to 'high', the voltage of the sub bit line SBL is amplified to 'high'. A voltage over the threshold voltage Vc to turn on the PNPN diode switch 11 is applied to the nano tube cell C depending on the difference between the high amplification voltage of the sub bit line SBL and the negative voltage of the word line WL. As a result, the PNPN diode switch 11 is turned on, and high data is written in the capacitor CAP of the nano tube cell C.

Here, in the period t5, hidden data "1" is written because all high data regard less of external data are written in the nano tube cell C connected to the driving word line WL.

Next, when a period t6 starts, if the write enable signal /WE is transited to 'high', the operation becomes at a read mode active state. Here, the voltage level of the word line WL rises to a pumping voltage VPP level, and the sub bit line SBL is connected to the main bit line MBL when the sub bit line selecting signal SBSW1 is transited to 'high'.

At this state, when the voltage of the sub bit line SBL is transited to 'low', data "0" is written in the nano tube cell C. On the other hand, when the voltage of the sub bit line SBL is transited to 'high', the high data written in the period t5 is maintained as it is, so that the data "1" is written in the nano tube cell C. Here, the sub bit line selecting signal SBSW2 is transited to 'low', so that external data can be written in the cell.

Figure 10:
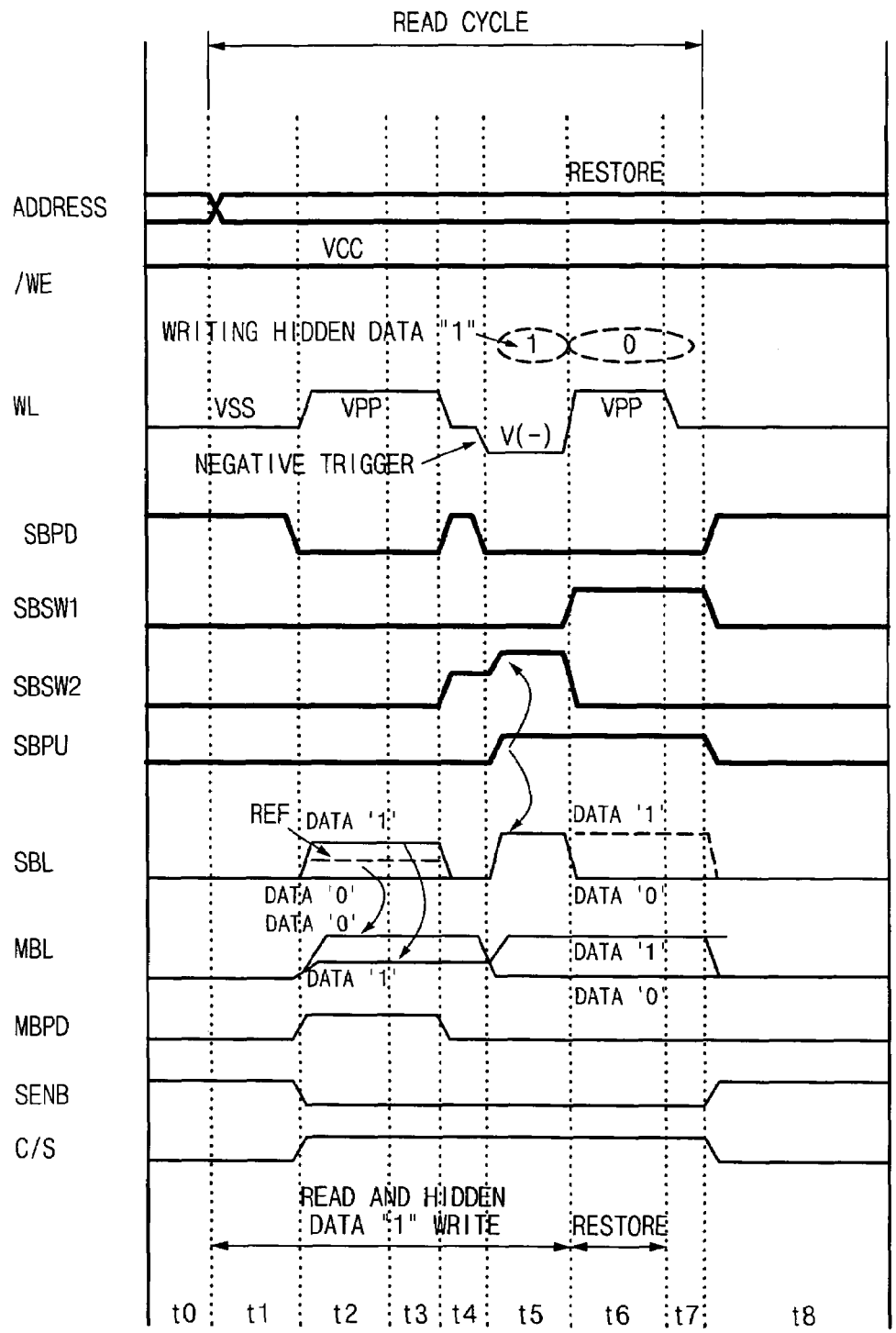
FIG. 10 is a timing diagram illustrating the read mode of the memory device using a nano tube cell according to an embodiment of the present invention.

FIG. 10 is a timing diagram illustrating the read mode of the memory device using a nano tube cell according to an embodiment of the present invention.

At the read mode, the write enable signal /WE is maintained at the power voltage VCC level. When a period t2 starts, if the word line WL is transited to the pumping VPP level, the PNPN diode switch 12 of the PNPN nano tube switch 10 is turned on. As a result, data of the nano tube cell C are transmitted to the sub bit line SBL and the main bit line MBL.

Here, the sub bit line pull-down signal SBPD is transited to 'low', and the main bit line pull-down signal MBPD is transited to 'high'. When the data stored in the capacitor CAP is 'low', the PNPN diode switch 12 is kept off, so that the voltage level of the sub bit line SBL is not changed. On the other hand, when the data stored in the capacitor CAP is 'high', the PNPN diode switch 12 is turned on, so that the voltage level of the sub bit line SBL rises to a high sensing voltage level.

As a result, the voltage levels of the sub bit line SBL and the main bit line MBL rise, so that the data stored in the nano tube cell C can be read.

As described above, a memory device using a nano tube cell has the following effects: to provide a DRAM having a hierarchical bit line structure including a main bit line and a sub bit line to reduce capacitance of each cell, thereby reducing the size of a capacitor: to provide a nano tube sub cell array using a capacitor and a PNPN nano tube switch which does not require an additional gate control signal, thereby reducing the whole size of the memory; and to effectively drive read/write operations in the above-described nano tube sub cell array using a PNPN nano tube switch, thereby improving operation characteristics of memory cells.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A memory device using a nanotube cell, comprising:
   a cell array block comprising a nanotube sub-cell array which has a hierarchical bit line structure including a main bit line and a sub-bit line and includes a plurality of unit nanotube cells arranged in row and column directions between a word line and the sub-bit line; and
   a sense amplifier array, connected to the cell array block through the main bit line, for sensing and amplifying data applied from the cell array block,
   wherein each of the plurality of unit nanotube cells comprises:
   a capacitor whose one terminal is connected to a word line; and
   a PNPN nanotube switch, which includes at least two or more PNPN diode devices successfully connected in series and divided into two groups each connected in parallel between the sub-bit line and the other terminal of the capacitor, for being selectively switched depending on voltage applied to the word line and the sub-bit line.

2. The memory device according to claim 1, wherein the cell array block comprises a plurality of nanotube sub-cell arrays.

3. The memory device according to claim 1, wherein each of the nanotube sub-cell arrays comprises:
   a plurality of unit nanotube cells located where a plurality of word lines arranged in a row direction and a plurality of sub-bit lines arranged in a column direction are crossed;
   a pull-up/pull-down driving switch for pulling up or pulling down the plurality of sub-bit lines;
   a first driving switch unit for controlling connection between the main bit line and the sub-bit line; and
   a second driving switch unit for pulling down the main bit line.

4. The memory device according to claim 1, wherein the PNPN nanotube switch comprises:
   a first PNPN diode switch connected forward between the sub-bit line and a bottom electrode of the capacitor; and
   a second PNPN diode switch connected backward between the sub-bit line and the bottom electrode of the capacitor.

5. The memory device according to claim 4, wherein the first PNPN diode switch has an upper P-type region connected to the bottom electrode and a lower N-type region connected to the sub-bit line.

6. The memory device according to claim 4, wherein the second PNPN diode switch has a lower N-type region connected to the bottom electrode and an upper P-type region connected to the sub-bit line.

7. The memory device according to claim 4, wherein when a voltage level of the word line is 'high' to turn on the first PNPN diode switch, the PNPN nanotube switch is switched to read high data stored in the capacitor, and
   when the voltage level of the word line is a negative voltage and a voltage level of the sub-bit line is 'high' to turn on the second PNPN diode switch, the PNPN nanotube switch is switched to write high data in the capacitor.

8. The memory device according to claim 1, wherein the sense amplifier array compnses:

a column selecting unit for controlling connection of the main bit line depending on a state of a column selecting signal;

a main bit line sensing unit for sensing data applied from the main bit line to output a first sensing signal when a sensing enable signal is activated;

a reference voltage generating unit for generating a reference voltage to output a second sensing signal under conditions corresponding to the column selecting unit and the main bit line sensing unit;

a comparison amplification unit for comparing and amplifying the first sensing signal and the second sensing signal to output a sensing output signal; and a write/restore regulating unit for performing a restore operation in a read path in response to the sensing output signal and outputting inputted data to the main bit line in a write path.

9. The memory device according to claim 8, further comprising:

a sensing load unit for controlling sensing load of the first sensing signal depending on a voltage level of the second sensing signal; and a main bit line sensing load unit for controlling sensing load of the second sensing signal depending on a voltage level of the second sensing signal.

10. The memory device according to claim 8, wherein the reference voltage generating unit comprises:

a reference current regulating unit for supplying a precharge voltage corresponding to a voltage level condition of the sub bit line, and setting reference voltage for distinguishing data depending on a predetermined reference voltage; and a sensing unit for sensing a voltage level of the reference current regulating unit to output the second sensing signal when the sensing enable signal is activated.

11. The memory device according to claim 10, wherein the reference current regulating unit comprises:

a first NMOS transistor precharged to a ground voltage level when a main bit line pull-down signal is enabled;

a second NMOS transistor for selectively supplying the ground voltage level depending on a level of the predetermined reference voltage; and a third NMOS transistor for regulating switch resistance in response to a reference voltage control signal under a condition corresponding to the column selecting unit.

* * * * *